United States Patent [19]

Magnussen, Jr. et al.

[11] Patent Number: 4,839,248
[45] Date of Patent: Jun. 13, 1989

[54] SYSTEM AND METHOD FOR DEPASSIVATING A PASSIVATED LITHIUM BATTERY IN A BATTERY POWERED MICROPROCESSOR CONTROLLED DEVICE

[75] Inventors: Haakon T. Magnussen, Jr., Orinda; Roy P. Moeller, Hayward; Phillip S. Palmer, Oakland; Gary L. Smith, Walnut Creek, all of Calif.

[73] Assignee: Rainin Instrument Co., Inc., Emeryville, Calif.

[21] Appl. No.: 144,179

[22] Filed: Jan. 15, 1988

[51] Int. Cl.$^4$ .............................. H01M 10/48
[52] U.S. Cl. ........................ 429/49; 429/61; 429/92; 429/50; 364/200
[58] Field of Search ............ 429/48, 49, 90–93, 429/61, 50; 320/2, 48, 49; 364/483, 200

[56] References Cited

U.S. PATENT DOCUMENTS

| | | | |
|---|---|---|---|
| 3,316,125 | 4/1967 | Makrides | 429/48 |
| 4,289,836 | 9/1981 | Lemelson | 429/93 X |
| 4,535,037 | 8/1985 | McManis et al. | 429/112 X |
| 4,608,753 | 9/1986 | Fleischer | 429/48 X |
| 4,654,278 | 3/1987 | McManis et al. | 429/112 |
| 4,680,527 | 7/1987 | Benenati et al. | 429/93 X |
| 4,684,583 | 8/1987 | Klinedinst et al. | 429/48 |

Primary Examiner—Anthony Skapars
Attorney, Agent, or Firm—Robert R. Meads

[57] ABSTRACT

A system for depassivating a passivated lithium battery in a battery powered microprocessor controlled device by successively and momentarily drawing current from the passivated battery after a turn on of the device while monitoring the power delivery condition of the battery under a load condition until salt crystals on an electrode of the battery are dissipated and the battery is returned to a useful power delivery condition or until a predetermined period of time has elapsed without the battery returning to the useful power delivery condition, whichever is sooner.

11 Claims, 5 Drawing Sheets

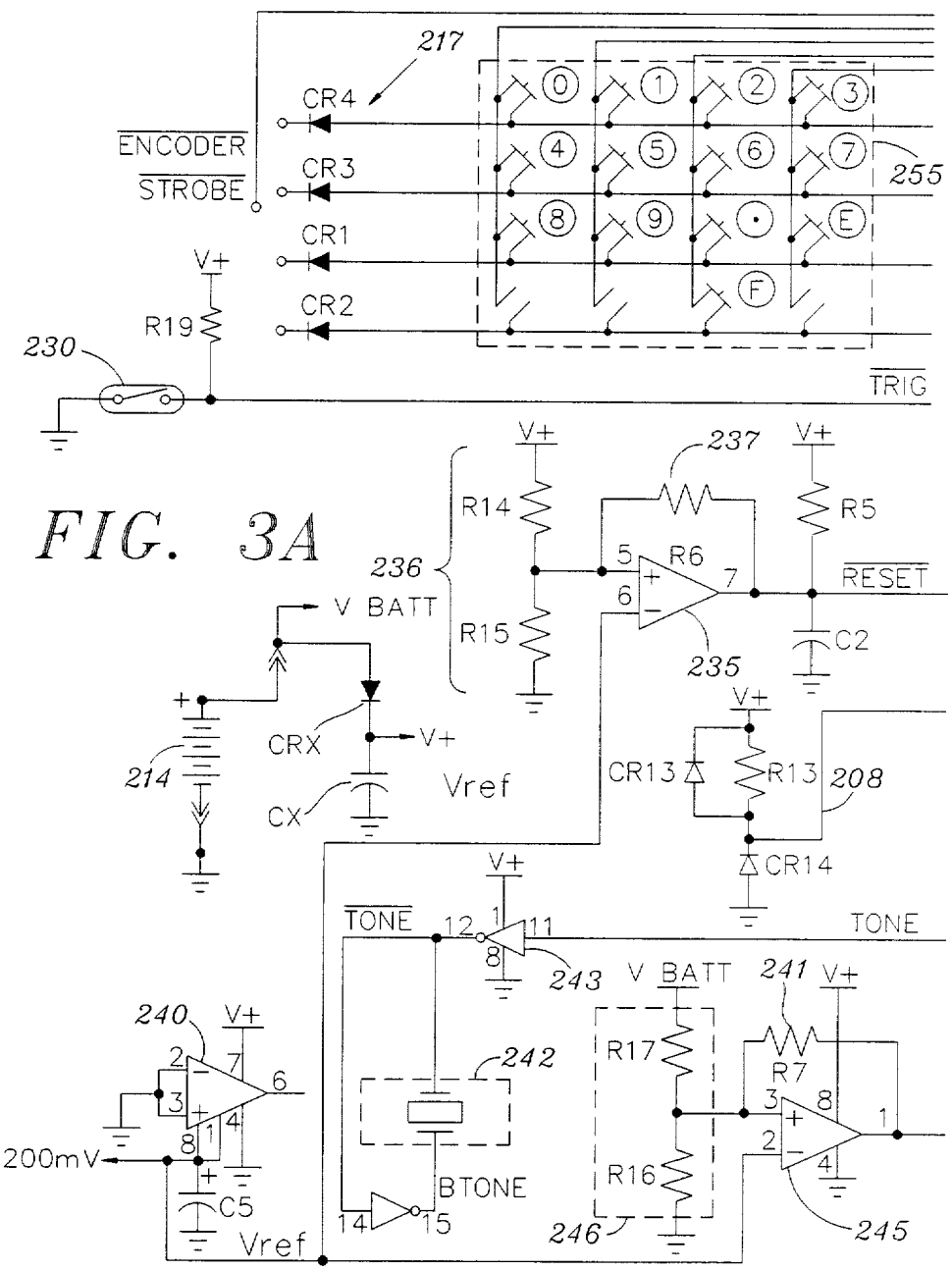

SYSTEM AND METHOD FOR DEPASSIVATING A PASSIVATED LITHIUM BATTERY IN A BATTERY POWERED MICROPROCESSOR CONTROLLED DEVICE

BACKGROUND OF INVENTION

The present invention relates to a system and method for depassivating a passivated lithium battery in a battery powered microprocessor controlled device.

More and more, lithium batteries are being utilized to power portable microprocessor controlled devices. As their use has grown, so has a recognition that lithium batteries are subject to a voltage delay often of an undesirable value. Strictly speaking, voltage delay is the time required for a battery to reach an acceptable voltage or power delivery condition after the application of a load. Lithium batteries are subject to voltage delays, often as long as several seconds, because the lithium anode within such batteries is subject to passivation with time. That is, salt crystals build up on the lithium surface of the anode which increase the internal resistance of the battery and reduce its response characteristics. Passivation in lithium batteries seems to be time and temperature sensitive. The longer a lithium battery is stored at elevated temperatures and the longer the period of time between the application of electrical loads to a lithium battery as by a turn on of a device in which the battery is situated, the greater the passivation and the greater the delay time.

Of course, any such voltage delay is undesired. In some cases, an undesired voltage delay just leads to user annoyance, having to wait longer than expected for a lithium battery powered device to respond after turn on. In other cases, particularly where the battery powered device is microprocessor controlled, an excessive voltage delay can be more than annoying, it can result in the device assuming undesired operating conditions in response to misinformation processed by the microprocessor, namely that the battery is dead or in such a state of age or power delivery condition that it requires replacement Such a condition can arise in battery powered microprcessor controlled devices designed to monitor for low battery conditions and if found to be present, issuing a signal to the microprocessor disabling keyboard and other functions of the device under microprocessor control.

In the past the problem of undesired voltage delay associated with lithium batteries has been addressed by battery manufacturers chemically coating the lithium surfaces of the electrodes in their lithium batteries. In practice, this has not represented a total solution to the problem. Still, significant numbers of lithium batteries are subject to undesired passivation and its associated voltage delay particularly when such batteries are stored at elevated temperatures for extended periods of time or are installed in battery powered devices and then used only infrequently.

SUMMARY OF INVENTION

Rather than approaching the problem of passivation in lithium batteries from an internal structural or chemical standpoint, the present invention provides an electronic solution particularly adaptable to microprocessor control. More specifically, the present invention provides an electronic system and method for depassivating a passivated lithium battery in a battery powered device. The method and system are particularly suited to control by a microprocessor within the device to successively and only momentarily draw current from the passivated battery upon a turn on of the device and while monitoring the power delivery condition of the battery under a load condition. The current drawn from the battery produces a dissipation of the salt crystals on the lithium anode within the battery depassivating the battery and quickly returning it to a useful power delivery condition at which time the depassivation process is halted. This result occurs in a minimum of time with a minimum of power being consumed and without loss of function of the microprocessor upon a turn on of the device for powering by a passivated lithium battery.

In a particularly preferred form of the present invention useful in a microprocessor controlled device, a series connected diode and capacitor are connected in parallel across the lithium battery such that the battery in an open circuit condition charges the capacitor to develop a voltage V+ there across. A first circuit means connects V+ to the microprocessor to energize the microprocessor upon a turn on of the device. Second circuit means controlled by the microprocessor complete a circuit connection between the battery and the device to apply battery voltage V batt to the device upon a turn on thereof to draw current from the battery while the microprocessor is being energized by V+. A monitor means monitors V batt and applies a low battery signal to the microprocessor when V batt is less than a predetermined value. Depassivation means controlled by the microprocessor and responsive to a turn on of the device momentarily actuates the second circuit means to momentarily draw current from the battery and momentarily interrogates the monitoring means for a low battery signal. In response to a low battery signal, the depassivation means returns the battery to an open circuit condition to recharge the capacitor to V+ and then reactuates the second circuit means to again momentarily draw current from the battery. This process recycles itself until operation of the depassivation means has dissipated salt crystals on an electrode of the lithium battery to return the battery to a useful power delivery condition for powering the device, or a predetermined period of time has elapsed during which the battery has not returned to a useful power delivery condition, whichever is sooner. If the battery has not returned to a useful power delivery condition during the predetermined period of time, the battery may require replacement or the user may reactuate the depassivation means by momentarily turning off and then turning back on the device to recycle the depassivation process.

The foregoing and other features of the system and the method of operation of the present invention may be more clearly understood by reference to the accompanying drawings and the following detailed description of a preferred form of the present invention.

BRIEF DESCRIPTION OF DRAWINGS

FIG. 3 illustrates how schematic circuit diagrams shown in FIGS. 3A, 3B, and 3C are related to depict a battery powered microprocessor controlled device including the depassivation system of the present invention.

FIG. 3A shows the battery power supply and keyboard circuits of the microprocessor controlled device including the depassivation system of the present invention.

DETAILED DESCRIPTION OF INVENTION

The preferred system and method of the present invention will be described hereinafter in association with the hand held self-contained automated pipette described and illustrated in the U.S. Pat. 4,671,123 issued June 9, 1987 for "Methods and Apparatus for Pipetting and/or Titrating Liquids Using a Hand Held Self-Contained Automated Pipette" and in such an automated pipette described and shown in copending patent Application Ser. No. 059,644 filed June 8, 1987 for "Portable Automated Pipette for Accurately Pipetting and/or Titrating Liquids", the above identified patent and pending patent application being assigned to the same assignee as the present application. For completeness of this specification, the above identified patent and pending patent application are hereby incorporated by reference in their entirety. Further, FIGS. 3, 3A, 3B, and 3C of this application correspond to similarly numbered figures in the above identified patent and copending patent application except for battery recharge circuit deletions and additions and changes noted hereafter.

Figure 3B:
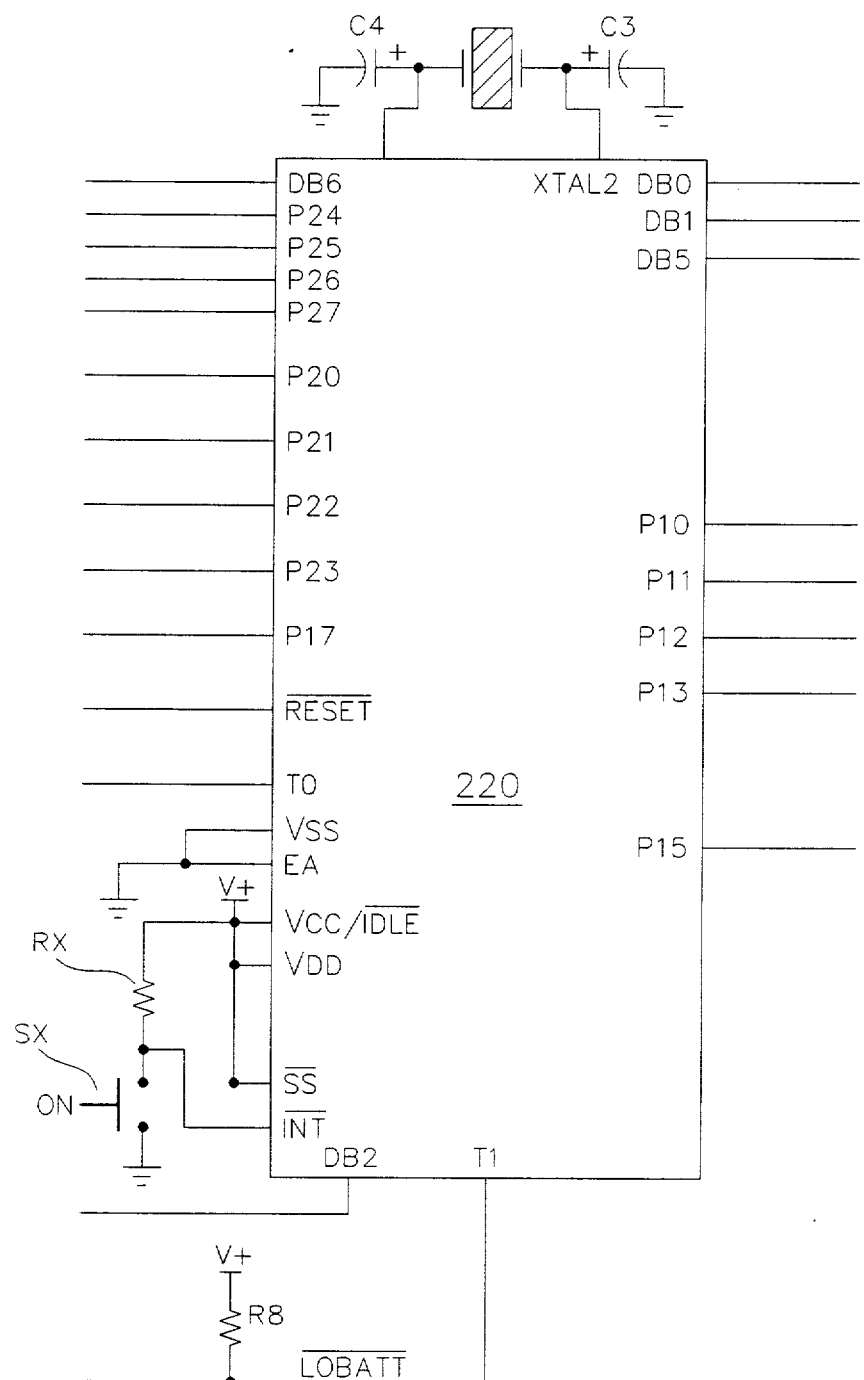
FIG. 3B shows the microprocessor circuit including a momentary turn on switch for actuating the device after a period of disuse and awakening the microprocessor from a sleep condition.

The copending patent application describes the microprocessor circuit 220 shown in FIG. 3B as being a type 80C51CMOS integrated circuit manufactured by the OKI Corporation of Tokyo, Japan. Alternatively, the microprocessor circuit 220 can be a type M50930 CMOS integrated circuit manufactured by Mitsubishi Electric Co. of Japan. Such microprocessors are characterized by a sleep mode and internal memory for storing coded information indicative of the state of the device which the microprocessor is controlling. In the sleep mode, the microprocessor 220 is powered down to a minimum level to conserve energy. No power is provided to drive the clock and gating functions of the microprocessor.

In FIG. 3B, the microprocessor is put to sleep by activation of a momentary on switch SX which connects the Interrupt terminal of the microprocessor 220 to ground true and initiates a sleep routine within the microprocessor placing the microprocessor in its sleep mode. When the switch SX is not closed, it connects a voltage V+ (hereinafter described) to the Interrupt terminal through a pull up resistor RX.

Upon the momentary closing of the switch SX, the same or a related routine interrogates the output ports P10-P13 of the microprocessor and stores in microprocessor memory coded data indicative of the operating state of the device controlled by the microprocessor at the time of device turn off and sleep mode initiation within a microprocessor 220. In the motor controlled pipette of FIGS. 3A, 3B, and 3C, the state of ports P10-P13 define which of motor coils C1-C4 are energized and hence the rotational position of the motor drive shaft in the pipette. In the sleep mode, ports P10-P13 are not energized and the circuits connecting the battery 214 and hence V batt to the pipette drive motor are effectively rendered open circuit to remove the motor load from the battery. The battery 214 thus assumes an open circuit condition, returning to its open circuit voltage independent of its power delivery condition under load.

When it is desired to again actuate the device and to wake up the microprocessor, the user simply presses the momentary on switch SX to again connect the Interrupt terminal of the microprocessor to ground true. This initiates a wake up routine within the microprocessor. V+ is applied to the microprocessor to energize or power the clock and gating functions of the microprocessor. In turn, the microprocessor initiates a routine which interrogates its memory and reads therefrom the coded data indicative of the condition of the pipette drive motor at the time the device was turned off and appropriately energizes ports P10-P13 to the same state as when the microprocessor went to sleep. The same motor coils C1-C4 are energized and the motor assumes the same state of operation as when the device was turned off. Such operation of the microprocessor completes circuits to the battery 214 applying V batt to the motor circuits and drawing current from the battery under load as when the device turned off. Thus, the rotational position of the motor drive shaft does not change with a turn off and turn on of the motor circuits under control of the microprocessor 220.

Figure 3C:
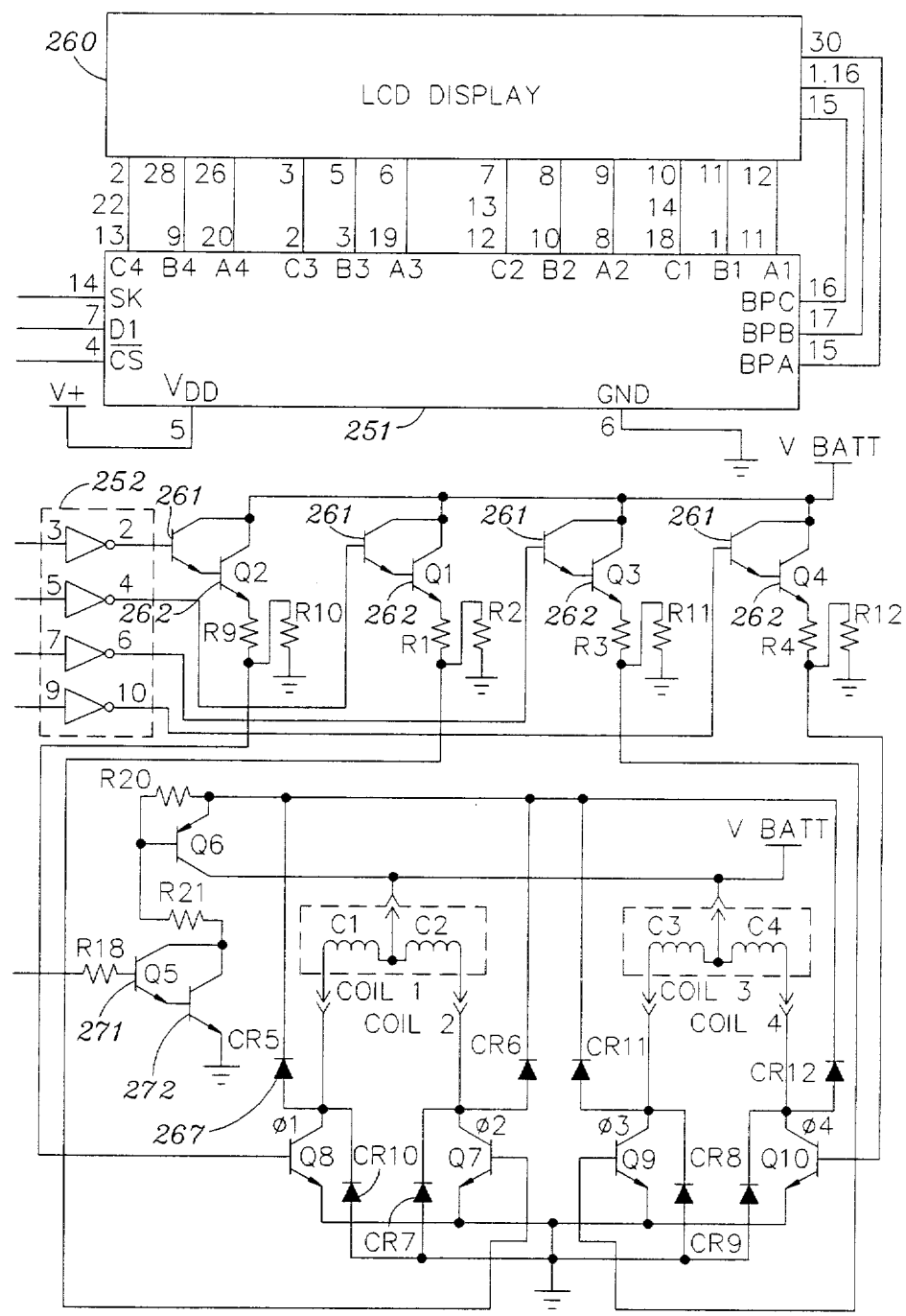
FIG. 3C shows display and load circuits in the device under control by the microprocessor.

In the circuits of FIGS. 3A, 3B, and 3C, the battery 214 is a lithium battery having an open circuit voltage of about 3.8 volts. As previously described, the lithium battery 214 may be subject to passivation particularly if it has been stored at elevated temperatures before installation within the motor driven pipette or if after installation the pipette has been used only infrequently. Under such conditions, when the pipette is turned on by actuation of the switch SX, the output voltage of the battery 214 may be less than that required to power the microprocessor 220 and drive the motor circuits controlled thereby. Further, except for the depassivation system of the present invention, the passivated battery 214 may give rise to a low battery display at 260 upon a turn on of the device and an awakening of the microprocessor 220. As described in the above referenced patent and pending patent application, such a low battery indication is accompanied by an interruption of all keyboard functions of the motor controlled pipette. In this regard, the above referenced patent states that a comparator 245 uses V ref and a voltage divider 246 to provide a low battery signal to a T1 pin of the microprocessor circuit 220 and in turn to the LCD260. Whenever the pipette is waiting for keyboard input or a trigger pull, the instrument checks for a low battery condition. The low battery signal from the comparator 245 is monitored only during times when the coils C1-C4 of the motor are not being energized. If a low battery condition is detected, the pipette warbles and displays the message "Lob". This message stays on the LCD260 for as long as the low battery condition is true, but not less than 250 milliseconds. While this message is displayed, all keyboard and trigger functions are disabled.

In FIG. 3A herein, the voltage divider 246 is connected to V batt. Hence the comparator 245 compares the output voltage of the battery 245 under load with the reference voltage and generates a low battery signal when the reference voltage is sufficiently different from the reference voltage. The low battery signal is applied to terminal T1 of the microprocessor 220 as indicated in FIG. 3B.

In the present invention, the passivated lithium battery 214 is quickly depassivated upon turn on of the device by momentary closing of the switch SX while sufficient power is provided to the microprocessor to drive the clock and gating functions thereof. Such depassivation occurs before the microprocessor enters its normal routines of operation to control the associated pipette. To accomplish this, a series connected diode CRX and filter capacitor CX are connected in parallel with the battery 214. The diode CRX isolates the battery 214 from the supply terminals of the microprocessor and reverse biases when the device is turned on and a voltage V+ is applied to the microprocessor. The filter capacitor is preferably about 33 microfarrads and is included to develop thereacross the voltage V+ for powering the low power needs of the microprocessor for a period of time sufficient to allow the battery 214 to undergo depassivation. Please note that the voltage v+ is applied to the microprocessor 220 while the output voltage from the battery v batt is applied to the motor control circuits in FIG. 3C whereby operation of a microprocessor completes circuits to the battery 214 to draw current therefrom during the depassivation process. When the microprocessor is asleep and during the depassivation process when the ports P10-P13 are deenergized, the battery 214 returns to its open circuit condition and through the diode CRX charges the capacitor CX to the voltage V+, slightly less than the battery open circuit voltage. In the case where the open circuit voltage is about 3.8 volts, V+ is about 3.5 volts.

To accomplish the desired depassivation of the battery 214 when passivated, the microprocessor 220 is programmed to follow the following depassivation instructions in a routine initiated by the momentary closing of the switch SX to waken the microprocessor 220.

DEPASSIVATION (DEPASS)

Clear INTO interrupt
Clear LCD memory
Put "---" in LCD memory
Turn on LCD
Change timer input to X/64
Disable "ON" key
Get present motor phase
Set bad battery counter to 20 seconds
Depassivate battery (PHASON)
Set timer to 10 milliseconds
Turn on phase and wait 10 milliseconds
Decrement bad battery counter
If counter zero
  Turn phase off
  Change timer input to X
  Sound buzzer (BUZ)
  Sound buzzer again (BUZ)
  Display "LOB" (LOWB)
  Enable "ON" key
Else counter not zero
  Test for low battery (TSTLOB)
  If low battery
    Turn off phase Wait 4 milliseconds
    Loop to turn on phase again (PHASON)
  Else not low battery
    Turn off lowbat circuit
    Set timer to 0.5 seconds
    Turn off phase
    Change timer input to X
    Sound buzzer (BUZ)
    Rebuild display (REBLD)
    Enable "ON" key
    Clear all interrupts End DEPASSIVATION.

Figure 1:
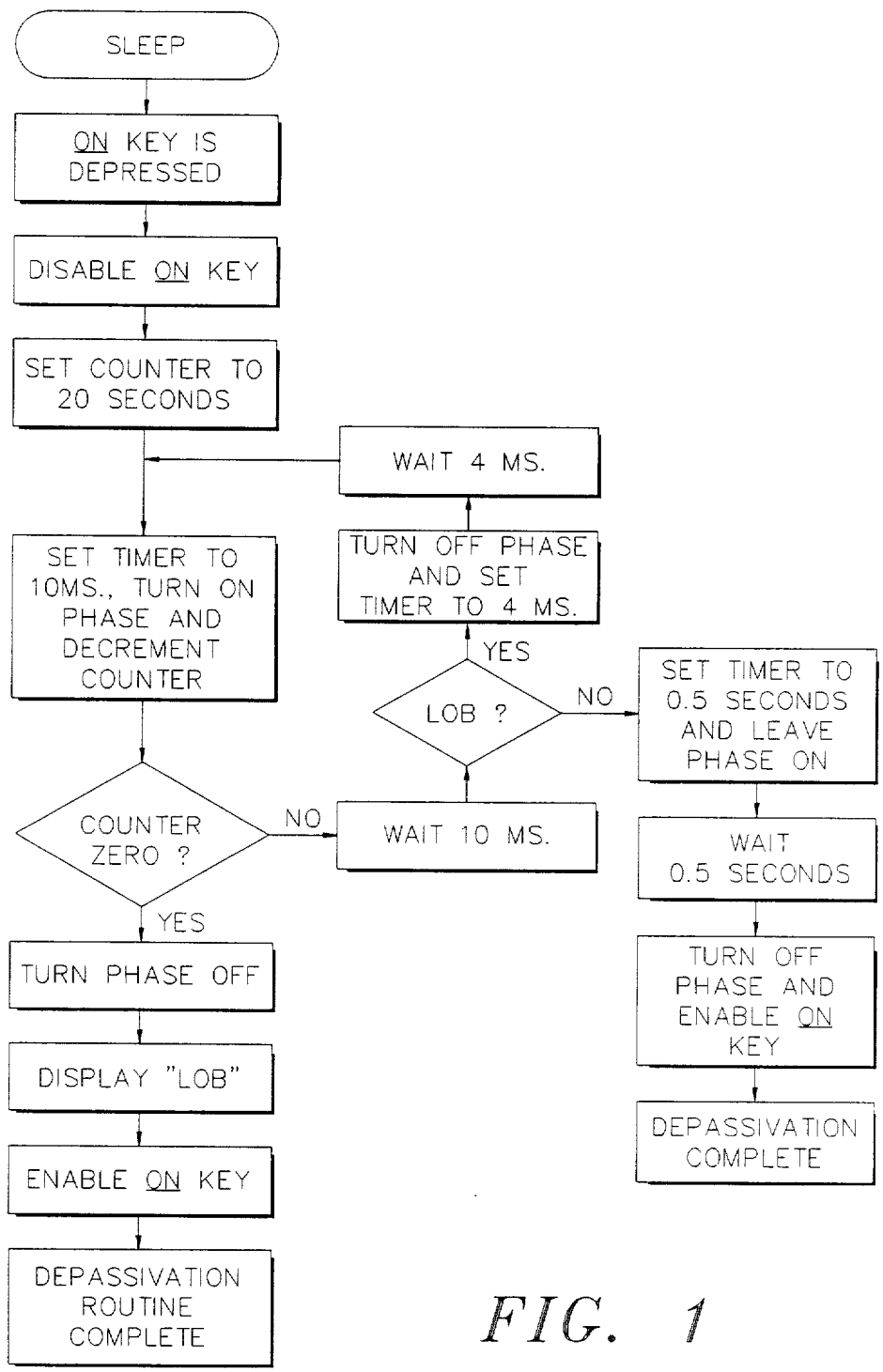
FIG. 1 is a flow diagram in block form depicting a simplified version of the method of depassivating a passivated lithium battery in a microprocessor controlled device in accordance with the present invention.
Figure 2A:
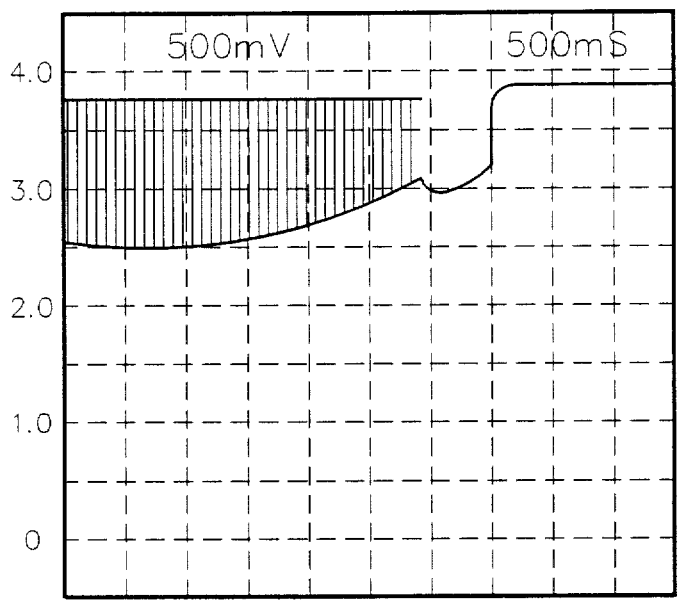
FIG. 2A is a battery voltage vs. time graph illustrating the recovery of a passivated battery by operation of the present invention as depicted in FIG. 1.
Figure 2B:
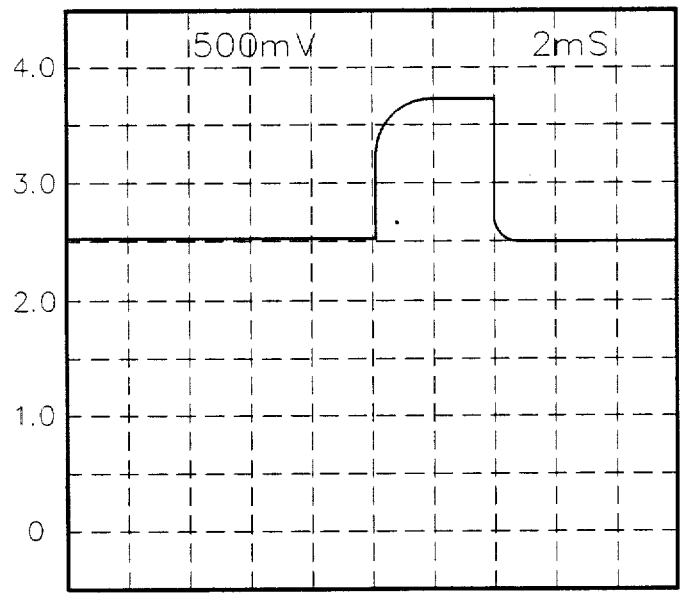
FIG. 2B is an enlarged showing of a single cycle of depassivation in the method depicted in FIG. 1 and as represented by a vertical line between a base of the voltage recovery envelope and an open circuit battery voltage in FIG. 2A.

FIG. 1 is a flow diagram of a simplified version of the routine set forth in instruction form above. FIG. 2A is a battery voltage vs. time graph illustrating the recovery of the passivated battery 214 by the method depicted in FIG. 1 following the routine of instructions set forth above. FIG. 2B is a large showing of a single cycle of depassivation in the method depicted in FIG. 1 and as represented by a vertical line between a base of the voltage recovery envelope in FIG. 2A and an open circuit battery voltage of about 3.8 volts.

As depicted in FIG. 1, the routine begins with the microprocessor 220 in a sleep mode. A closing of the momentary on switch SX clears the Interrupt by connecting the Interrupt terminal to ground true. In addition, in the above described routine, the LCD memory is cleared and the symbol "---" placed in memory. The LCD 260 is then turned on to display the "---" to the user. This indicates to the user that the pipette is processing his or her actuation of the device by the closure of the momentary on switch SX.

Next, the microprocessor responds to the instructions set forth above to change the input to an internal timer within the processor so that the timer responds to each 64th clock pulse. Also, the microprocessor is disabled from responding to subsequent operations of the momentary on switch SX during the period of time that the battery 214 is being depassivated.

As previously described, and as indicated in the foregoing routine of instructions, the microprocessor next interrogates its internal memory for the coded information indicative of the condition of the motor circuit when the device was turned off and the microprocessor put to sleep. Such coded information is readied to energize the ports P10-P13 upon instructions to "turn on phase".

The next step within the depassivation routine is to set a counter within the microprocessor to time out upon the elapse of 20 seconds. The counter is designated in the instructions as a "bad battery counter". The routine now enters the depassivate battery subroutine entitled "phason". This begins with the setting of a timer within the microprocessor to 10 milliseconds and the phase turn on to draw current from the battery 214 through the circuits controlled by the microprocessor. As this occurs, the "bad battery counter" and timer count toward zero. The counter is interrogated and if it has reached a zero condition, turn off phase occurs to remove power from the ports P10-P13 to halt the draw of current from the battery 214. The internal timer is set to its original condition and subroutines initiated to produce two buzz or beeps and the LCD 260 energized to display "Lob". The microprocessor is then conditioned to respond to subsequent momentary closures of SX and enters its normal program of operation under a low battery condition.

If the counter is not zero, current is drawn from battery 21 for 10 milliseconds and the microprocessor responds to a low battery test by interrogating terminal T1 for a low battery signal. If a low battery signal is present, ports P10-P13 are deenergized to return the battery 214 to an open circuit condition and halt the draw of current therefrom. As this occurs, the microprocessor sets its internal timer to 4 milliseconds. While the timer counts to zero, the battery 214 in an open circuit condition recharges the capacitor CX to V+ and the subroutine loops to Phason to repeat the depassivation subroutine as just described. Such recycling of the depassivation subroutine will continue until the repeated momentary drawing of current from the battery 214 dissipates salt crystals built up on the lithium anode within the battery to return the battery to a useful power delivery condition above about 3 volts.

When upon test for low battery, interrogation of the terminal T1 by the microprocessor fails to locate a low battery signal, the low battery circuit turns off and the timer is set for ½ second. The ports P10-P13 remain energized until the timer times out at which time they are deenergized, the timer returned to its original condition, and the buzzer subroutine initiated to signal the user that the device is ready for normal use. As this occurs, a display of the LCD 260 is rebuilt and the microprocessor is enabled to respond to subsequent actuation of the momentary on switch SX to again place the microprocessor in a sleep mode and turn off the device. Also, all Interrupts are cleared and the microprocessor is ready to control subsequent operation of the device in response to entries by the user into the keyboard and actuation of the trigger within the pipette.

As previously indicated, FIGS. 2A and 2B graphically depict the recovery of a passivated lithium battery in accordance with the above described depassivation routine and the method of FIG. 1. In FIG. 2A each division along the X-axis is 500 milliseconds and each division along the Y-axis is 0.5 volts. The open circuit voltage for the battery is 3.8 volts. Upon a turn on of the device powered by the battery, and application of a load to the battery, the output voltage of the battery immediately drops to about 2.5 volts (as represented by the first vertical line between the open circuit voltage 3.8 volts and the voltage recovery envelope shown in FIG. 2A). Such a voltage output from the battery is below the threshold provided by the reference voltage for the comparator 245, for example, less than 3 volts, and the comparator develops a low battery signal at terminal T1 of the microprocessor 220. In entering the depassivation routine and as most clearly depicted in FIG. 2B, (where each division along the X-axis is 2 milliseconds) the load is applied to the battery and current dawn therefrom for a period of 10milliseconds. The low battery test reveals a continuing low battery condition and the load is removed from the battery which returns almost instantaneously to its open circuit voltage of 3.8 volts. The battery remains at the open circuit voltage for 4 milliseconds while the capacitor CX is recharged to V+. Then, the depassivation loop recycles and a load is again applied to the battery for 10 milliseconds to draw current therefrom. The value of CX is chosen to insure that the voltage V+ will maintain the microprocessor in operation for at least the 10 milliseconds. Each depassivation recycle takes 14 milliseconds and if the battery is capable of being depassivated, at the end of each cycle, the output voltage is slightly greater as depicted in FIG. 2A. Please note that in FIG. 2A only a few of the 14 millisecond cycles are depicted for the sake of clarity. In any event, as the output voltage of the battery under load and depassivation increases with time, it reaches a value greater than the 3 volt threshold. Then upon test for low battery condition, the answer is "no." When this occurs, power continues to be applied to the device from the battery for ½ second to increase depassivation and the depassivation cycle completes as indicated in FIG. 1. This is depicted in FIG. 2A by the portion of the recovery envelope to the immediate right of the time when the battery returns to a useful power delivery condition represented by an output voltage of 3 volts.

For batteries that are only slightly passivated, the foregoing routine may take but a few milliseconds. For others, such as depicted in FIGS. 2A and 2B, it may take about 3 seconds. In a worst case situation, the depassivation may take as long as the 20 second operating time of the counter within the microprocessor. If at the end of the 20 second time interval, the battery has yet to return to a useful power delivery condition, the user may at his option reinitiate the depassivation method of the present invention simply by turning off the microprocessor and associated device and turning it on again by actuation of the switch SX.

While a particular preferred embodiment of the present invention has been described as being particularly useful with the motor controlled pipette of the above referenced patent and copending patent application, it is to be appreciated that the present invention is applicable to other lithium batttery devices both microprocessor and non-microprocessor controlled. Such applications and the changes and modifications in the system and method described herein necessary to such applications are within the scope of the present invention which is limited only to the following claims.

We claim:

1. Apparatus for depassivating a passivated lithium battery, comprising:
    means for momentarily drawing current from the passivated battery to cause a depassivation thereof; and
    means for monitoring the power delivery condition of the battery and for controlling the momemtary drawing of current from the passivated battery until salt crystals on an electrode in the battery are dissipated and the battery has returned to a useful power delivery condition.

2. Apparatus for depassivating a passivated lithium battery, comprising:
    first means for momentarily drawing current from the passivated battery to cause a depassivation thereof; and
    second means for periodically monitoring the power delivery condition of the battery and for actuating the first means if the battery has not yet returned to a useful power delivery condition.

3. A system for depassivating a passivated lithium battery in a battery powered device, comprising:
    monitoring means for monitoring the lithium battery and for generating a low battery signal when the battery delivers an output voltage less than a predetermined value; and
    depassivation means responsive to a user turn on of the device for (i) momentarily drawing current from the lithium battery, (ii) momentarily interrogating the monitoring means and (iii) recycling in response to a low battery signal.

4. A system for depassivating a passivated lithium battery in a battery powered microprocessor controlled device, comprising;

microprocessor controlled depassivation means for momentarily drawing current from the passivated battery;

monitoring means for momentarily monitoring the power delivery condition of the passivated battery; and means responsive to the monitoring means for recycling successive operation of the depassivation and monitoring means until operation of the passivation means has dissipated salt crystals on an electrode in the battery and returned the battery to a useful power delivery condition for powering the microprocessor controlled device.

5. In a battery powered microprocessor controlled device:

a lithium battery for developing an output voltage V batt for powering the device and which may be passivated over a period of disuse of the device;

a series connected diode and capacitor in parallel with the battery, the battery in an open circuit condition charging the capacitor to develop V+ there across;

a microprocessor;

first circuit means for connecting V+ to the microprocessor to energize the microprocessor;

second circuit means controlled by the microprocessor for completing a circuit connection between the battery and the device to apply V batt to the device and draw current from the battery while the microprocessor is energized by V+, the battery otherwise being in an open circuit condition to recharge the capacitor;

monitoring means for monitoring V batt and for applying a low battery signal to the microprocessor when V batt is less than a predetermined value; and depassivation means controlled by the microprocessor and responsive to a turn on of the device after a period of disuse for (i) momentarily actuating the second circuit means to momentarily draw current from the battery and (ii) momentarily interrogating the monitoring means for the low battery signal and in response thereto reactuating the second circuit means to again momentarily draw current from the battery.

6. The combination of claim 5 wherein the microprocessor is characterized by a low power consumption sleep mode when the device is turned off and stores in memory the state of the device at the time of turn off and wherein the microprocessor is programmed to read from memory and return the device to the turn off state upon a turn on of the device.

7. The combination of claim 5 wherein the depassivation means includes means for recycling operation of the depassivation means until such operation has dissipated salt crystals on an electrode in the battery to return the battery to a useful power delivery condition for powering the device or a predetermined period of time has elapsed, whichever is sooner.

8. The combination of claim 7 wherein the depassivation means includes;

counter means setable by operation of the microprocessor for counting for the predetermined period of time, and timer means setable by operation of the microprocessor for controlling the period of time between successive actuations of the second circuit means when the capacitor is charged to V+ by the battery.

9. A method for depassivating a passivated lithium battery comprising successively momentariy drawing current from the battery and monitoring the power delivery condition of the battery until salt crystals on an electrode of the battery are dissipated and the battery has returned to a useful power delivery condition or a predetermined period of time has elapsed, whichever is sooner.

10. A method of depassivating a passivated lithium battery in a battery powered microprocessor controlled device comprising the steps of;

monitoring the power delivery condition of the battery and generating a low battery signal when the output voltage of the battery is below a predetermined value;

charging a capacitor to V+ from the battery in an open circuit condition;

upon turn on of the device
    (1) fully energizing the microprocessor from V+,
    (2) momentarily drawing current from the battery through the device, and
    (3) checking for a low battery signal and if present halting the drawing of current from the battery and allowing the battery to recharge the capacitor to V+ then repeating steps (2) and (3), and if not present maintaining a current drawing circuit connection for the battery to the device.

11. A system for depassivating a passivated lithium battery and for enabling and disabling operations of a device powered by the lithium battery, comprising:

a lithium battery;

a device powered by the lithium battery;

lithium battery depassivation circuit means responsive to a turn on of the system for momentarily drawing current from the lithium battery when in a state of passivation, the current being sufficient to dissipate salt crystals on an electrode in the battery and return the battery to a useful power delivery condition; and means for disabling operational features of the device during depassivation of the lithium battery and for enabling operation of the disabled operational features of the device when the lithium battery is in a useful power delivery condition.

* * * * *